United States Patent
Berkey et al.

(10) Patent No.: US 7,874,743 B2
(45) Date of Patent: Jan. 25, 2011

(54) PRESSURE EQUALIZING EQUIPMENT HOUSING

(75) Inventors: Thomas F. Berkey, Tavernier, FL (US); Michael Camelia, Boca Raton, FL (US)

(73) Assignee: Sensormatic Electronics, LLC, Boca Raton, FL (US)

( * ) Notice: Subject to any disclaimer, the term of this patent is extended or adjusted under 35 U.S.C. 154(b) by 483 days.

(21) Appl. No.: 11/667,989

(22) PCT Filed: Nov. 23, 2005

(86) PCT No.: PCT/US2005/042824

§ 371 (c)(1),
(2), (4) Date: Mar. 24, 2008

(87) PCT Pub. No.: WO2006/058259

PCT Pub. Date: Jun. 1, 2006

(65) Prior Publication Data

US 2008/0314899 A1 Dec. 25, 2008

Related U.S. Application Data

(60) Provisional application No. 60/630,465, filed on Nov. 23, 2004.

(51) Int. Cl.
*G03B 17/00* (2006.01)

(52) U.S. Cl. .................. 396/427; 396/429; 396/535; 348/143; 348/160

(58) Field of Classification Search .............. 396/427
See application file for complete search history.

(56) References Cited

U.S. PATENT DOCUMENTS

| | | | | |
|---|---|---|---|---|
| 2,677,996 | A * | 5/1954 | Laval, Jr. | 396/19 |
| 3,717,078 | A * | 2/1973 | Ogura | 396/26 |
| 4,065,894 | A * | 1/1978 | Day | 52/171.3 |
| 4,607,468 | A * | 8/1986 | Paquet | 52/172 |
| 4,771,299 | A * | 9/1988 | Gell, Jr. | 396/26 |
| 4,771,320 | A * | 9/1988 | Gell | 396/26 |
| 4,835,926 | A * | 6/1989 | King | 52/171.3 |
| 4,853,722 | A * | 8/1989 | Gell, Jr. | 396/26 |
| 5,714,214 | A * | 2/1998 | Larsen | 428/34 |
| 6,061,087 | A * | 5/2000 | Schieltz et al. | 348/151 |
| 6,624,845 | B2 * | 9/2003 | Loyd et al. | 348/151 |
| 6,735,382 | B2 * | 5/2004 | Schneider | 396/26 |

* cited by examiner

*Primary Examiner*—W. B. Perkey
*Assistant Examiner*—Bret Adams

(57) ABSTRACT

A pressure equalizing housing may be used to house equipment (e.g., one or more mechanical and/or electronic devices). The pressure equalizing housing may include a pressure equalization device to provide pressure equalization between an internal pressure inside of the housing and an ambient pressure outside of the housing. The pressure equalization prevents relatively humid air outside of the housing from passing into the housing and thus prevents or substantially minimizes condensation inside of the housing.

21 Claims, 3 Drawing Sheets

PRESSURE EQUALIZING EQUIPMENT HOUSING

CROSS-REFERENCE TO RELATED APPLICATIONS

This application claims the benefit of co-pending U.S. Provisional Patent Application Ser. No. 60/630,465, filed on Nov. 23, 2004, which is fully incorporated herein by reference.

TECHNICAL FIELD

The present invention relates to equipment housings and more particularly, to a pressure equalizing equipment housing that prevents condensation on the inside of the housing.

BACKGROUND INFORMATION

Equipment such as a mechanical or electrical device may not function properly if it is subjected to moisture or condensation. Enclosures may protect such devices from dripping water on the outside but may not prevent direct condensation from forming inside the enclosure, for example, during extreme temperature cycling. When the environment around an enclosure cools, the inside walls of the enclosure may cool and the air inside may eventually cool. When the inside air cools, the relative pressure inside the enclosure may drop, drawing external air into the enclosure (e.g., through leaks in the enclosure). The external air may be near 100% relative humidity, for example, when the enclosure is rapidly cooled in a rainstorm. The relative humidity of the air inside the enclosure may eventually reach the relative humidity of the air outside the enclosure, and when cooled further, may cause condensation inside of the enclosure.

One type of equipment enclosure is an outdoor video dome for a video camera. A video dome enclosure may be mounted above an area of interest and may have an optically clear or transparent bubble forming the bottom half of the enclosure. An integral pan-tilt-zoom mechanism may be used to observe the area of interest (e.g., parking lots, security gates, building entrances and etc.) usually below and to the sides of the dome. Existing outdoor video dome enclosures may have a condensation problem, especially when located in a coastal humid environment. Condensation on the inside or outside of the bubble may render the dome useless. Condensation on the inside may form a haze on the bubble that obscures the view and may also collect into droplets that run down into the bottom of the bubble to obscure the view. The life of the electronics and mechanical components in the enclosure may also be shortened through corrosion caused by condensation.

Sealed enclosures have been designed to prevent air from entering. Sealed enclosures may leak, however, when subjected to relatively high differential pressures between the inside and outside of the enclosure. Sealed enclosures may be even more difficult to seal when cables need to be run through the walls of the enclosure. A hermetically sealed enclosure solution may work under ideal conditions, but in many cases, is too cost prohibitive and unreliable.

BRIEF DESCRIPTION OF THE DRAWINGS

These and other features and advantages will be better understood by reading the following detailed description, taken together with the drawings wherein.

DETAILED DESCRIPTION

Figure 1:
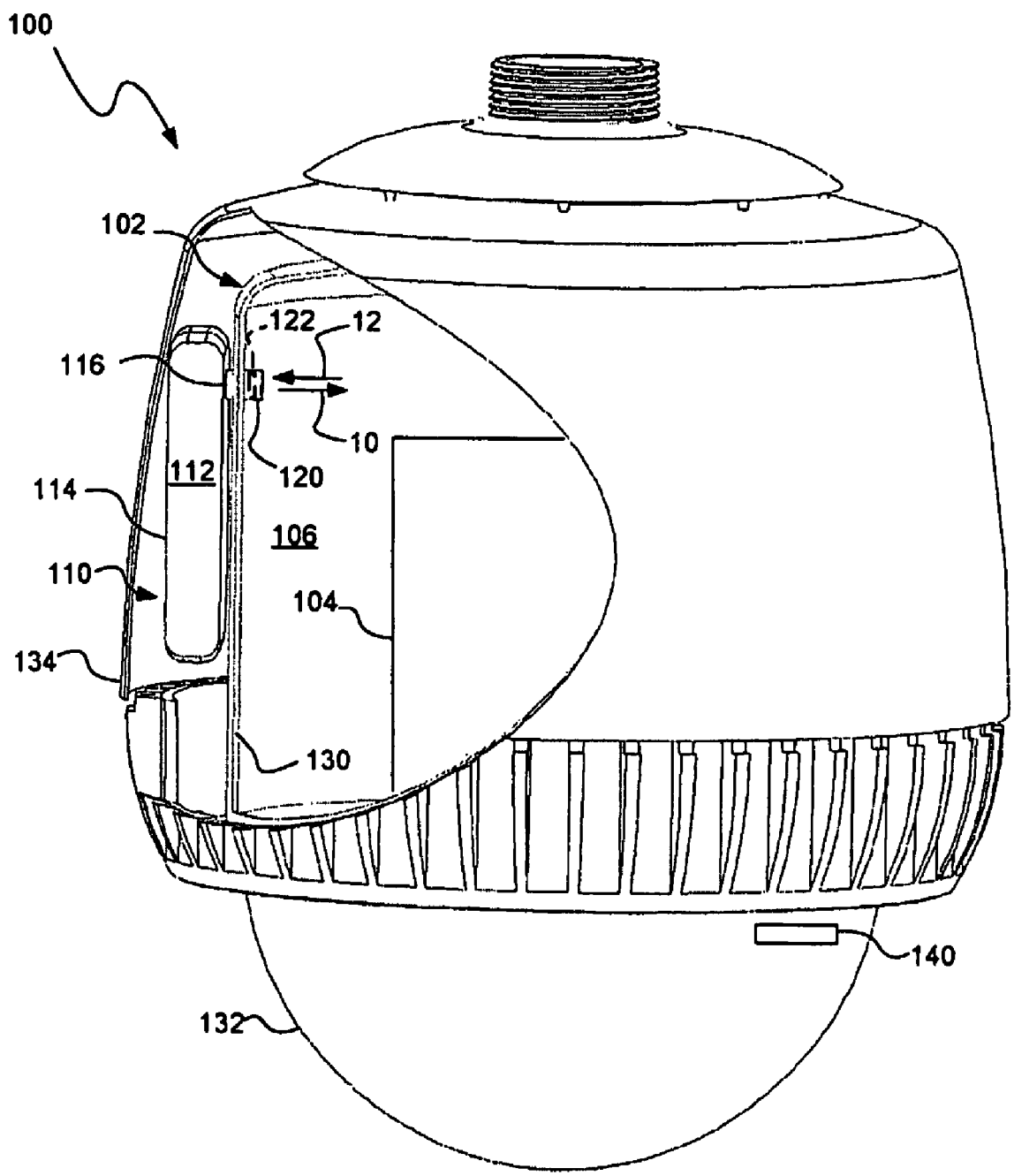
FIG. 1 is a partial cross-sectional view of a pressure equalizing equipment housing, consistent with one embodiment of the present invention.

Referring to FIG. 1, a pressure equalizing equipment housing 100 may be used to house equipment including one or more mechanical devices and/or electronic devices. The pressure equalizing equipment housing 100 provides pressure equalization between an internal pressure inside of a sealed enclosure 102 and an ambient pressure outside of the housing 100. By equalizing the pressure, the internal pressure inside of the sealed enclosure 102 will not be higher or lower than the ambient pressure outside of the housing 100. Maintaining pressure equalization with the surrounding atmosphere thus minimizes or eliminates pressure differentials that may cause leaks through the sealed enclosure 102. Minimizing leaks into and out of the sealed enclosure 102 may thus reduce the possibility of condensation inside of the sealed enclosure 102.

The sealed enclosure 102 of the pressure equalizing equipment housing 100 encloses equipment 104 within an interior region 106. The pressure equalizing equipment housing 100 may also include a pressure equalization device 110 defining a volumetrically adjustable chamber 112 configured to expand and contract to change its volume. The pressure equalization device 110 may be coupled to the sealed enclosure 102 by way of a sealed fluid connection such that air or gas flows freely between the interior region 106 and the chamber 112, allowing the chamber 112 to expand and contract.

When the temperature inside the sealed enclosure 102 increases, the internal gas will try to expand. If it were not permitted to expand the internal pressure would increase with respect to ambient pressure. Similarly, when the temperature inside the sealed enclosure 102 decreases, the internal gas will try to contract, lowering the relative pressure. Changes in the ambient atmospheric pressure also cause a pressure differential. Relative pressure differential caused by ambient temperature changes may be four (4) times those due to atmospheric pressure changes alone. The pressure equalizing equipment housing 100 may compensates for pressure differential caused by both ambient temperature changes and atmospheric pressure changes.

When the relative ambient pressure increases, a higher pressure outside the housing 100 causes the volumetrically adjustable chamber 112 to contract and decreases the volume of the chamber 112, causing air or gas to flow from the chamber 112 into the interior region 106 (e.g., in the direction of arrow 10) until the pressure is equalized. When the relative ambient pressure decreases, a higher pressure inside the sealed enclosure 102 causes the volumetrically adjustable chamber 112 to expand and increases the volume of the chamber 112, causing air or gas to flow from the interior region 106 into the chamber 112 (e.g., in the direction of arrow 12) until the pressure is equalized. As a result, the internal pressure within the sealed enclosure 102 may be continually equalized with the ambient pressure, which minimizes the pressure differentials that may cause leaks. In other words, the same recycled air or trapped gas within the enclosure 102 flows into and out of the pressure equalizing device 110 as the ambient pressure changes, instead of air or gas flowing between the sealed enclosure 102 and the surrounding environment.

The pressure equalization device 110 may be configured such that the volume of the volumetrically adjustable chamber 112 is capable of changing to a degree that will accommodate relative ambient pressure changes. In other words, the volumetrically adjustable chamber 112 may allow enough contraction to adjust to the highest expected increases in relative ambient pressure and may allow enough expansion to adjust to the highest expected decreases in relative ambient pressure. In one example, the volumetrically adjustable chamber 112 is designed to allow a volumetric change of about 50% to accommodate ambient pressure changes in a range of about 6% and ambient temperature changes over a range of about −40° C. to +50° C. The pressure equalization device 110 may be installed (e.g., coupled to the sealed enclosure 102) with the volumetrically adjustable chamber 112 in a non-pressurized state and with an initial volume that allows the desired expansion or contraction.

According to one embodiment, the pressure equalization device 110 may include a flexible container 114 (e.g., a flat bag type bladder) that defines the chamber 112. The flexible container 114 may be made of a flexible or compliant material such as a rubberized cloth or a vinyl impregnated cloth. The flexible container 114 may have a size that allows the volumetrically adjustable chamber 112 to expand and contract to adjust to the ambient pressure changes without causing the material to stretch. If the chamber 112 is too small, the chamber 112 may not sufficiently expand or contract to accommodate larger changes in ambient temperature. Allowing the chamber 112 to expand by stretching the material may cause a pressure differential, which may force some air or gas through leaks in the enclosure. In one example, the flexible container 114 may provide a maximum volume (i.e., in a fully expanded state without stretching) of about 50% of the compressible gas volume contained within the sealed enclosure 102.

The pressure equalization device 110 may also include a conduit 116, such as a breather tube, coupled to the flexible container 114 to provide the fluid connection to the sealed enclosure 102. The conduit 116 includes a passageway that is large enough to allow air or gas to flow freely between the chamber 112 of the flexible container 114 and the interior region 106 of the sealed enclosure 102. In one example, the conduit 116 may have a passageway with a diameter of at least about 2 millimeters.

According to one embodiment, the pressure equalization device 110 may be removably coupled to the sealed enclosure 102. The equipment housing 100 may include a connection port 120 coupled to the sealed enclosure 102 and configured to removably engage the conduit 116 extending from the flexible container 114. The connection port 120 may include an automatically closing valve mechanism 122, such as a self-sealing flap, which closes upon disconnection of the pressure equalization device 110 to prevent outside air from flowing into the sealed enclosure 102. The automatically closing valve mechanism 122 may thus restrict the flow of humid air into the sealed enclosure 102 during installation of the housing 100 or during replacement of the pressure equalization device 110. Those skilled in the art will recognize that any known connections or couplings may be used to removable couple the pressure equalization device 110 to the sealed housing 102.

In an exemplary embodiment, the sealed enclosure 102 may be configured to enclose a video camera or other such equipment and may include a main enclosure portion 130 and a transparent bubble portion 132. The main enclosure portion 130 protects and supports the camera equipment and may be made of a metal material. The transparent bubble portion 132 protects the camera while providing an unimpeded field of view for the camera and may be made of a transparent plastic material. In this embodiment, the pressure equalization device 110 is coupled to the main enclosure portion 130. A ventilated shroud 134 may be positioned over at least the main enclosure portion 130 and the pressure equalization device 110. Examples of enclosures designed for cameras include the video dome housings available under the name SpeedDome® from Tyco Fire and Security.

The pressure equalizing housing 100 may be used in conjunction with a desiccant and/or nitrogen gas to absorb moisture and/or prevent trapping high humidity air during the installation process. The desiccant may be located, for example, in the interior 106 of the sealed enclosure 102 or in the chamber 112 of the pressure equalization device 110. The desiccant may be provided as a desiccant bag or pouch including, for example, Silica-Gel, NatraSorb, or other materials for absorbing moisture. Because the pressure equalization minimizes leaks through the sealed enclosure 102, the life of the desiccant may be extended.

The pressure equalizing housing 100 may also be purged with dry nitrogen gas to displace humid air within the enclosure and replace the humid air with dry nitrogen gas. The pressure equalizing housing 100 may be purged with dry nitrogen using techniques known to those skilled in the art either before or after connecting the pressure equalization device. Because the pressure equalization minimizes leaks through the sealed enclosure 102, the nitrogen gas may be prevented from leaking out of the sealed enclosure 102 and the nitrogen charge may be extended.

The pressure equalizing housing 100 may also include a humidity sensing device 140 to monitor and report the humidity level within the sealed enclosure 102. Examples of the humidity sensing device 140 include, but are not limited to, an electronic humidity sensor and a chemical coated indicator strip that changes in color with changes in humidity. The humidity sensing device 140 may report the humidity level within the enclosure 102 without opening the enclosure 102. An indicator strip, for example, may be located such that the strip may be viewed through the transparent bubble 132 or through another viewing window in the enclosure 102. The humidity sensing device 140 may also be located such that a video camera within the enclosure 102 captures an image of the humidity level. The image of the humidity level may then be transmitted to other locations and the humidity level may be remotely displayed and monitored. Allowing the remote monitoring of humidity level may eliminate unnecessary preventive maintenance.

Figure 2A:
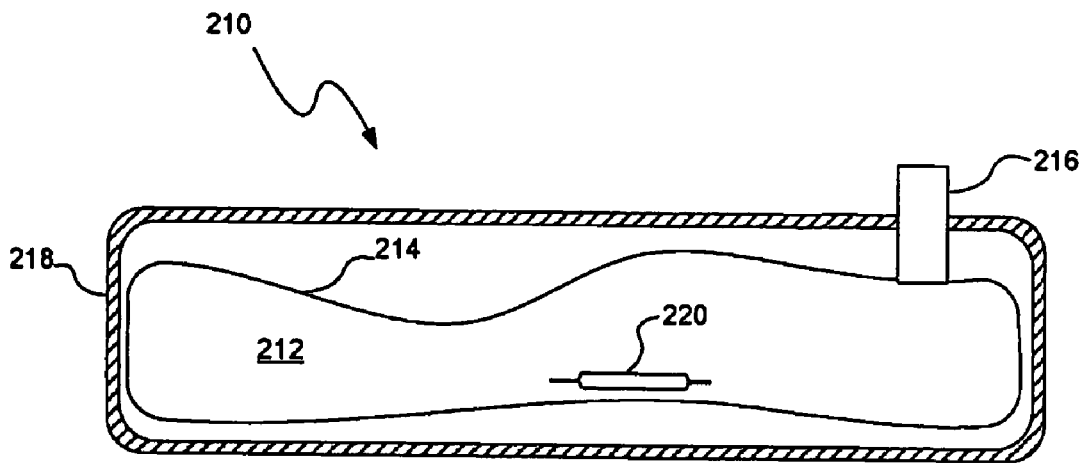
FIGS. 2A-2C are partial cross-sectional views of a pressure equalization device, consistent with one embodiment of the present invention, in various states of expansion.
Figure 2B:
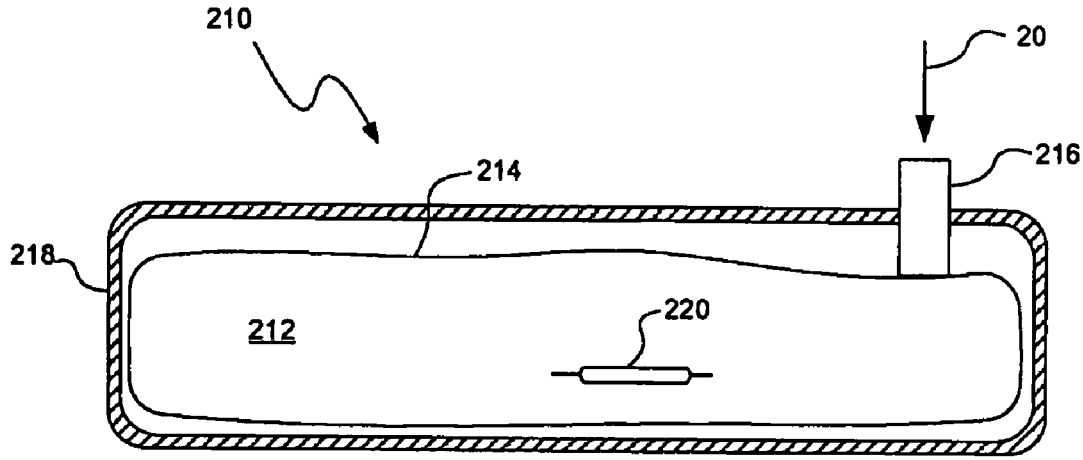
Figure 2C:
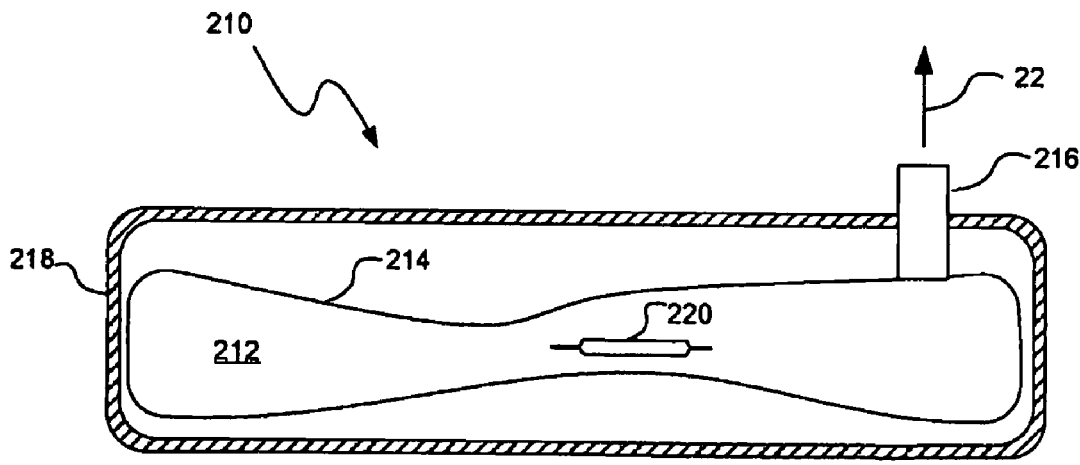

Referring to FIGS. 2A-2C, another embodiment of a pressure equalization device 210 is described in greater detail. The pressure equalization device 210 may include a flexible container 214 (e.g., a flat bag or bladder) located inside of a protective housing 218. The flexible container 214 defines a volumetrically adjustable chamber 212 and the protective housing 218 is vented to allow the flexible container 214 to expand and contract in response to changes in ambient pressure. The protective housing 218 may be made of a material such as plastic, metal or other rigid material capable of protecting the flexible container 214. The flexible container 214 may not require a protective housing 218 if it is made of a durable material or is protected by another overall shroud (e.g., shroud 134 shown in FIG. 1). The pressure equalization device 210 may include a conduit 216, such as a breather tube, configured to couple the pressure equalization device 210 to the sealed enclosure 102 (FIG. 1). The pressure equalization device 210 may also include a desiccant such as a desiccant bag or pouch 220 or a desiccant in the form of pellets or beads to absorb any moisture in the air passing into the chamber 212. The pressure equalization device 210 may be removably coupled to the sealed enclosure 102 and may be provided as a replaceable cartridge.

Initially (e.g., when the pressure equalization device 210 is coupled to a sealed enclosure), the flexible container 214 may be in a relaxed, non-pressurized state, as shown in FIG. 2A. When the ambient temperature rises or the relative ambient pressure decreases (e.g., after installation), air or gas flows into the chamber 212 (e.g., in the direction of arrow 20) and the flexible container 214 expands to equalize pressure, as shown in FIG. 2B. When the relative ambient pressure increases, air or gas flows out of the chamber 212 (e.g., in the direction of arrow 22) and the flexible container 214 contracts to equalize pressure, as shown in FIG. 2C.

Figure 3A:
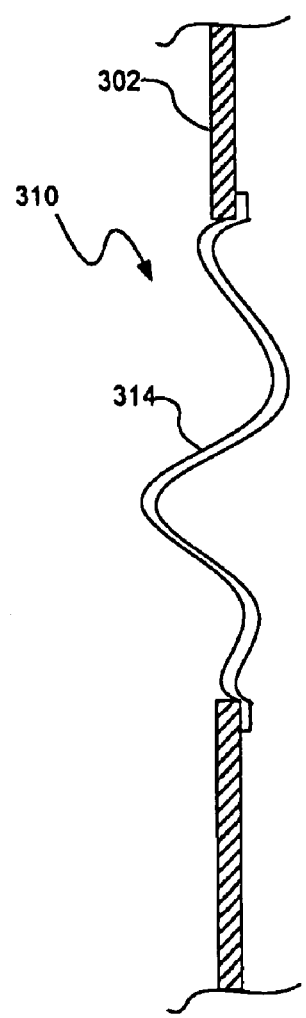
FIGS. 3A-3C are cross-sectional views of a pressure equalization device, consistent with another embodiment of the present invention, in various states of expansion.
Figure 3B:
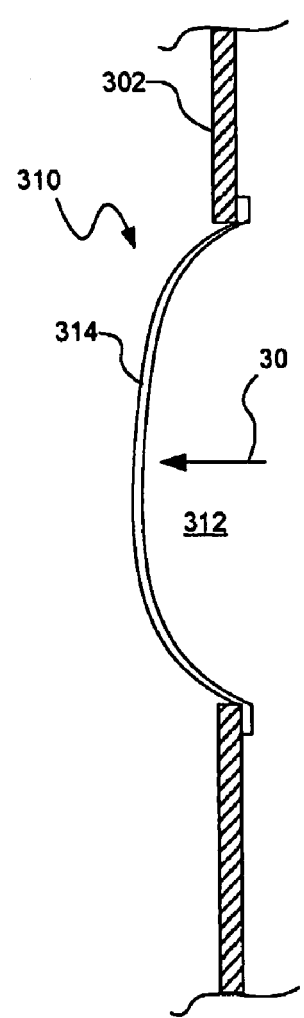
Figure 3C:
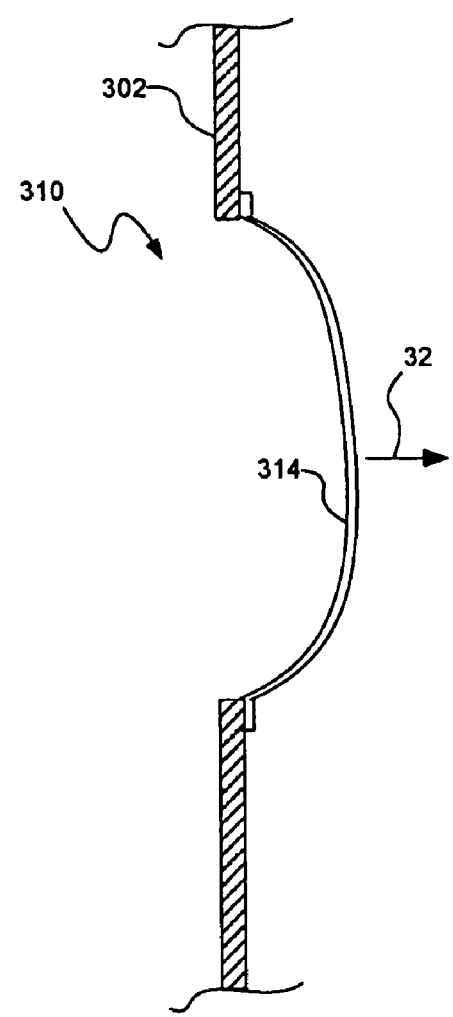

Referring to FIGS. 3A-3C, a further embodiment of a pressure equalization device 310 may include a flexible sidewall 314 of a sealed enclosure 302. Initially (e.g., when the housing is installed), the flexible side wall 314 may be in a relaxed, non-pressurized state, as shown in FIG. 3A. When the relative ambient pressure decreases, air or gas-flows toward the flexible side wall 314 (e.g., in the direction of arrow 30) into a volumetrically adjustable chamber 312 and the flexible side wall 314 expands to equalize pressure, as shown in FIG. 3B. When the relative ambient pressure increases, air or gas flows away from the flexible side wall 314 (e.g., in the direction of arrow 32) and the flexible side wall 314 contracts to equalize pressure, as shown in FIG. 3C.

Accordingly, a pressure equalizing housing may prevent pressure differentials that cause humid air to leak into the housing and dry air or gas (e.g., nitrogen gas) to leak out of the housing.

Consistent with one embodiment of the present invention, a pressure equalizing equipment housing includes a sealed enclosure configured to enclose equipment and a pressure equalizing device defining a volumetrically adjustable chamber. The pressure equalizing device may be coupled to the sealed enclosure such that air or gas flows freely between an interior of the enclosure and the volumetrically adjustable chamber. The volumetrically adjustable chamber may be configured to adjust sufficiently to equalize an internal pressure inside the sealed enclosure with an ambient air pressure outside of the sealed enclosure.

Consistent with another embodiment of the present invention, an enclosed device includes equipment, a sealed enclosure enclosing the equipment, and a pressure equalizing device defining a volumetrically adjustable chamber. The pressure equalizing device may be coupled to the sealed enclosure such that air or gas flows freely between an interior of the enclosure and the volumetrically adjustable chamber. The volumetrically adjustable chamber may be configured to adjust sufficiently to equalize an internal pressure inside the sealed enclosure with an ambient air pressure outside of the sealed enclosure.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A pressure equalizing equipment housing comprising:
    a sealed enclosure configured to enclose equipment;
    a pressure equalizing device defining a volumetrically adjustable chamber, said pressure equalizing device being coupled to said sealed enclosure such that air or gas flows freely between an interior of said sealed enclosure and said volumetrically adjustable chamber, and wherein said volumetrically adjustable chamber is configured to adjust sufficiently to equalize an internal pressure inside said sealed enclosure with an ambient air pressure outside of said sealed enclosure; and
    a humidity sensing device inside of said sealed enclosure.

2. The pressure equalizing equipment housing of claim 1 further comprising a desiccant located inside said chamber.

3. The pressure equalizing equipment housing of claim 2 wherein said pressure equalizing device comprises a flexible container defining said chamber, said flexible container being removably coupled to said enclosure.

4. The pressure equalizing equipment housing of claim 3 further comprising a connection port removably connecting said flexible container to said enclosure, said connection port including an automatic closing valve mechanism to restrict flow when said container is removed.

5. The pressure equalizing equipment housing of claim 1 further comprising dry nitrogen inside said sealed enclosure.

6. The pressure equalizing equipment housing of claim 1 wherein said pressure equalizing device comprises a flat bag defining said chamber.

7. The pressure equalizing equipment housing of claim 1 wherein said pressure equalizing device comprises a flexible container defining said chamber and a protective housing around said flexible container.

8. The pressure equalizing equipment housing of claim 7 wherein said flexible container and said protective housing are removably coupled to said sealed enclosure.

9. The pressure equalizing equipment housing of claim 1 wherein said pressure equalizing device comprises a flexible sidewall of said sealed enclosure, said flexible sidewall defining said chamber.

10. The pressure equalizing equipment housing of claim 1 wherein said pressure equalizing device comprises a flexible container defining said chamber and a conduit coupling said flexible container to said enclosure.

11. The pressure equalizing equipment housing of claim 1 wherein said sealed enclosure includes a main enclosure portion and a transparent bubble portion coupled to said main enclosure portion.

12. The pressure equalizing equipment housing of claim 11 wherein said pressure equalizing device is coupled to said main enclosure portion, and further comprising a shroud around at least said main enclosure portion and said pressure equalizing device.

13. An enclosed device comprising:
    equipment; a sealed enclosure enclosing said equipment; and a pressure equalizing device defining a volumetrically adjustable chamber, said pressure equalizing device being coupled to said sealed enclosure such that air or gas flows freely between an interior of said enclosure and said volumetrically adjustable chamber, and wherein said volumetrically adjustable chamber is configured to adjust sufficiently to equalize an internal pressure inside said sealed enclosure with an ambient air pressure outside of said sealed enclosure; and
    a humidity sensing device inside of said enclosure.

14. The enclosed device of claim 13 wherein said equipment includes a camera.

15. The enclosed device of claim 14 wherein said sealed enclosure includes a video dome enclosure.

16. The enclosed device of claim 14, wherein said camera is configured to capture an image of a humidity level indicated by said humidity sensing device.

17. The enclosed device of claim 13 wherein said pressure equalizing device comprises a flexible container defining said chamber.

18. The enclosed device of claim 13 wherein said pressure equalizing device comprises a flexible sidewall of said sealed enclosure, said flexible sidewall defining said chamber.

19. The enclosed device of claim 13 further comprising a desiccant located inside said chamber.

20. The enclosed device of claim 16, wherein said image of a humidity level is transmitted to a remote location.

21. The pressure equalizing equipment housing of claim 11, wherein said humidity sensing device can be viewed through said transparent bubble portion of the sealed enclosure.

* * * * *